United States Patent [19]
Lee

[11] Patent Number: 5,960,261
[45] Date of Patent: Sep. 28, 1999

[54] METHOD FOR MANUFACTURING SEMICONDUCTOR PACKAGE

[75] Inventor: Won Sang Lee, Seoul, Rep. of Korea

[73] Assignee: LG Electronics, Inc., Seoul, Rep. of Korea

[21] Appl. No.: 08/890,555

[22] Filed: Jul. 9, 1997

[30] Foreign Application Priority Data

Jul. 27, 1996 [KR] Rep. of Korea ....................... 96/30792

[51] Int. Cl.$^6$ ........................... H01L 21/44; H01L 21/48; H01L 21/50
[52] U.S. Cl. ........................... 438/123; 438/125; 257/666; 257/673; 257/676
[58] Field of Search ..................................... 438/111, 123, 438/125, FOR 366, FOR 377, FOR 380; 257/666, 673, 676

[56] References Cited

U.S. PATENT DOCUMENTS 4,355,463 10/1982 Burns ........................................ 29/827
5,073,521 12/1991 Braden ..................................... 437/209

*Primary Examiner*—John F. Niebling
*Assistant Examiner*—David A. Zarneke

[57] ABSTRACT

A method for manufacturing a semiconductor package in which production time and cost are reduced and production yield is increased is disclosed, including the steps of: providing a backer having a groove, a cap of the backer, a semiconductor chip having a bonding pad, and a lead frame; coating a binder on an edge portion of the recess of the backer and an edge portion of the cap of the backer; mounting the semiconductor chip on the recess of the backer; forming a conductive material on an edge portion of a lead in the lead frame and contacting the lead having the conductive material thereon with the bonding pad of the semiconductor chip; contacting the backer and the cap; and trimming and forming the lead frame.

5 Claims, 5 Drawing Sheets

F I G.2C
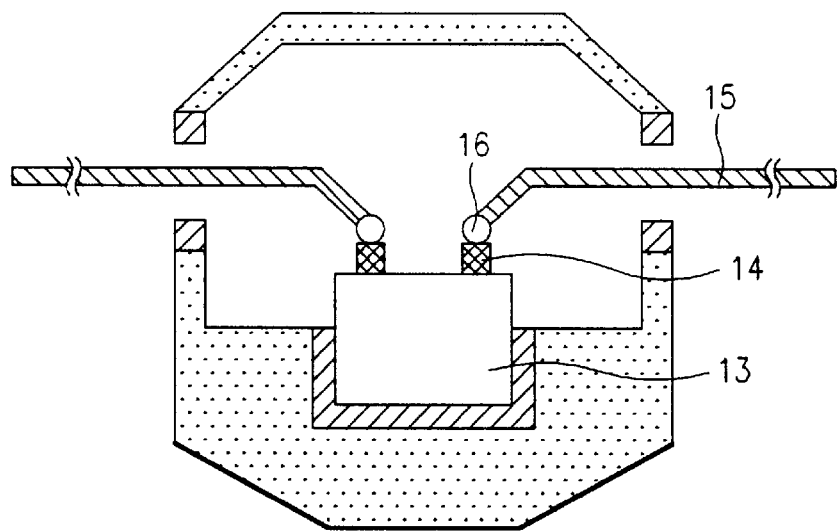
F I G.2D
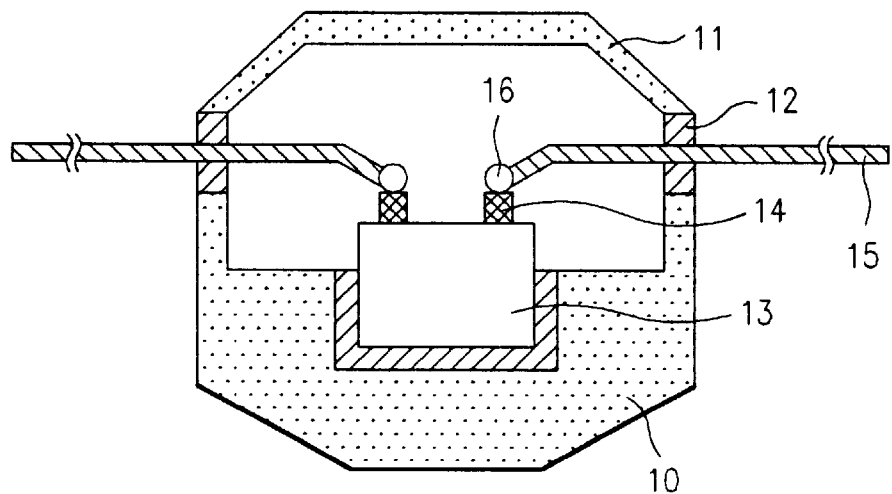

F I G.2E
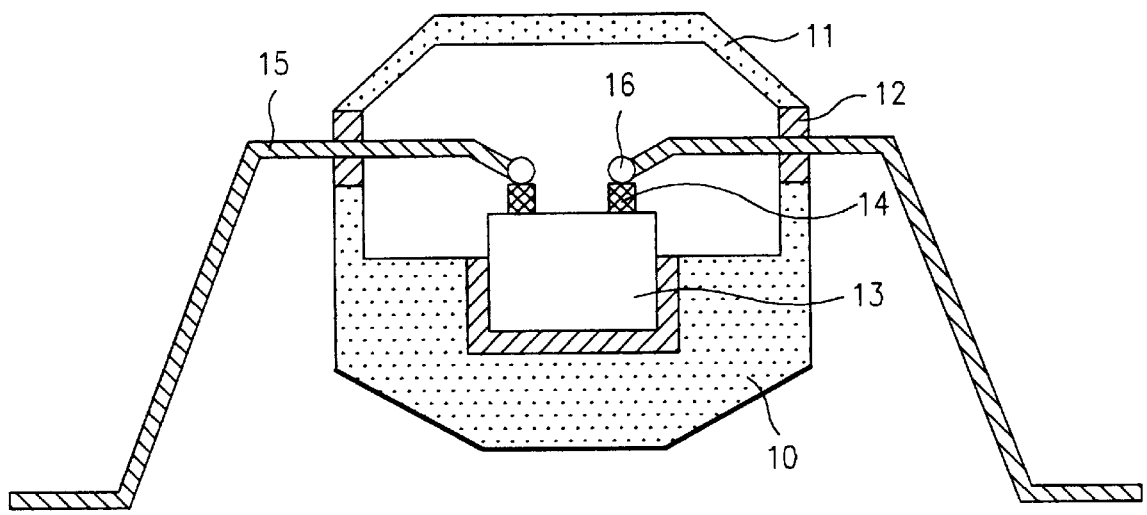

METHOD FOR MANUFACTURING SEMICONDUCTOR PACKAGE

BACKGROUND OF THE INVENTION

1. Field of the Invention

The present invention relates to semiconductor packages and, more particularly, to a method for manufacturing semiconductor packages.

2. Discussion of Related Art

To fabricate a semiconductor package, a fabrication (FAB) process for forming integrated circuits on a wafer is performed. Thereafter, chips formed on the wafer are diced, each of the diced chips is bonded on a die bonding pad of a respective lead frame, and the bonding pads on the chips and inner leads of the lead frame are electrically connected with bonding wires. Next, the a molding step is performed for protecting the circuit.

After the step of molding, a support bar and a dam bar of the lead frame are trimmed and outer leads are formed in a predetermined form thereby completing the whole process of manufactoring the semiconductor package.

FIGS. 1A and 1D are cross-sectional views illustration steps of a conventional method for manufacturing a semiconductor package. As shown in FIG. 1A, a semiconductor chip 3 on which a bonding pad 2 is formed is die-bonded on a die bonding pad of the lead frame using an eutectic material 4 such as Au epoxy, AuSn, or AuSi. This die-boding is performed at a temperature of 200° C.–300° C. for 5 minutes–2 hours.

Subsequently, the bonding pad 2 formed on the surface of the semiconductor chip 3 is electrically connected to an inner lead 5 in the lead frame, as shown in FIG. 1B, by means of a wire 6 made of Ag or aluminum.

Next, as shown in FIG. 1C, all except an outer lead 8 are enveloped with an epoxy molding compound 7. Thereafter, as shown in FIG. 1D, the molded semiconductor package is cut from the lead frame and the outer lead 8 is formed in a desired form, thereby completing the semiconductor package.

However, the conventional method for manufacturing the semiconductor package has the following problems. First, since, it as long as takes 2 hours for the step of curing after die bonding, its production cost is high. Second, heat or ultrasonic waves are used for wire-bonding, so micro cracks may occur in the semiconductor chip. Third, since it takes so much time for wire-bonding and molding, the manufacturing process is inefficient and uneconomical.

SUMMARY OF THE INVENTION

Therefore, the present invention is directed to a method for manufacturing a semiconductor package that substantially obviates one or more of problems due to limitations and disadvantages of the related art.

An object of the invention is to provide a method for manufacturing a semiconductor package in which production time and cost are reduced and production yield is enhanced.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for manufacturing a semiconductor package includes providing a backer having a recess and a cap of the backer, a semiconductor chip having a bonding pad, and a lead frame; coating a binder on an edge portion of the recess of the backer and an edge portion of the cap of the backer; mounting the semiconductor chip in the recess of the backer; forming a conductive material on an edge portion of a lead in the lead frame and then contacting the lead having the conductive material thereon with the bonding pad of the semiconductor chip; contacting the backer and the cap; and trimming and forming the lead frame.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which:

FIGS. 2A to 2E are cross-sectional views showing process steps in a method for manufacturing a semiconductor package according to a preferred embodiment of the present invention.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2E are cross-sectional views showing process steps in a method for manufacturing a semiconductor package according to a preferred embodiment of the present invention.

Figure 1A:
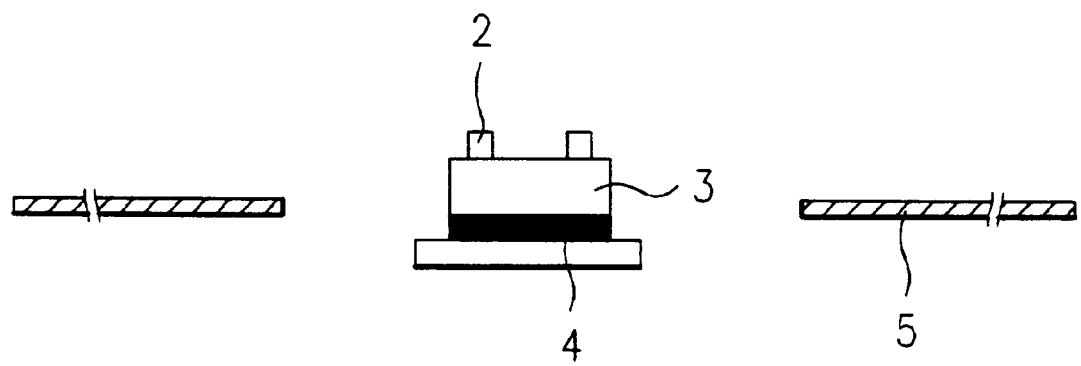
FIGS. 1A to 1D are cross-sectional views showing process steps in a conventional method for manufacturing a semiconductor package.
Figure 1B:
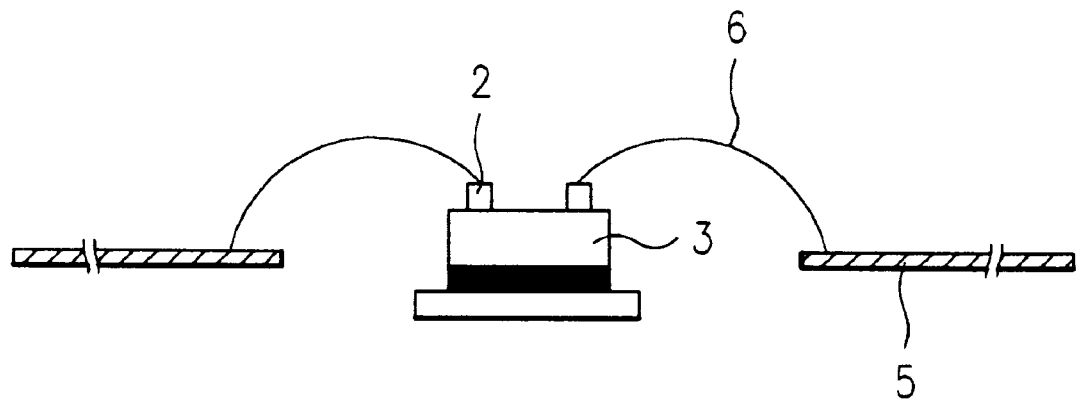
Figure 1C:
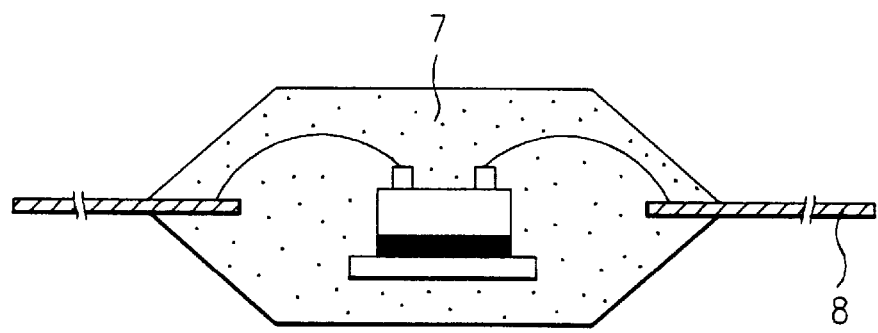
Figure 1D:
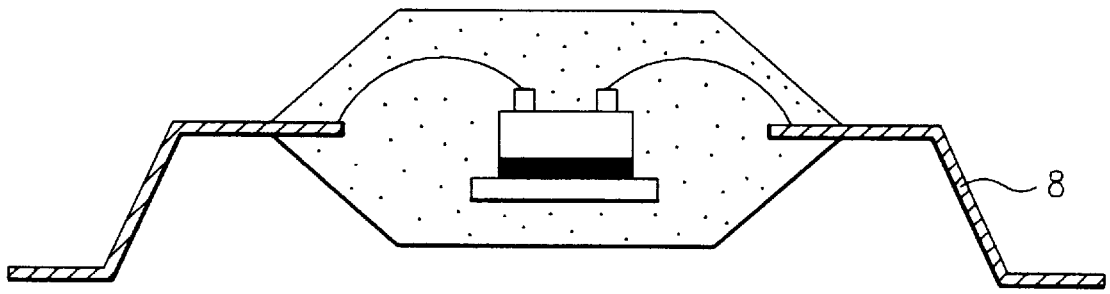
Figure 2A:
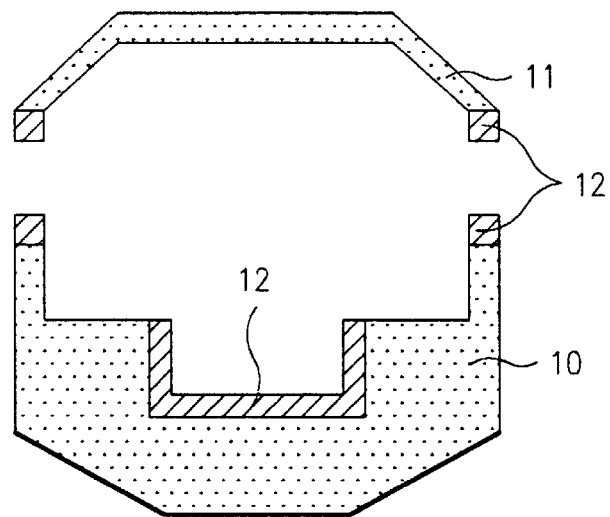

As shown in FIG. 2A, a backer 10 and a cap 11 that serves as a lid of the backer 10 are provided. Subsequently, a binder 12 is coated on a recess of formed in the backer 10 and on respective edge portions of the backer 10 and the cap 11. The the size of the backer 10 depends on the size of a semiconductor chip. The binder coated on the recess of the backer 10 and on the edge portions of the backer 10 and the cap 11 are material identical material.

Figure 2B:
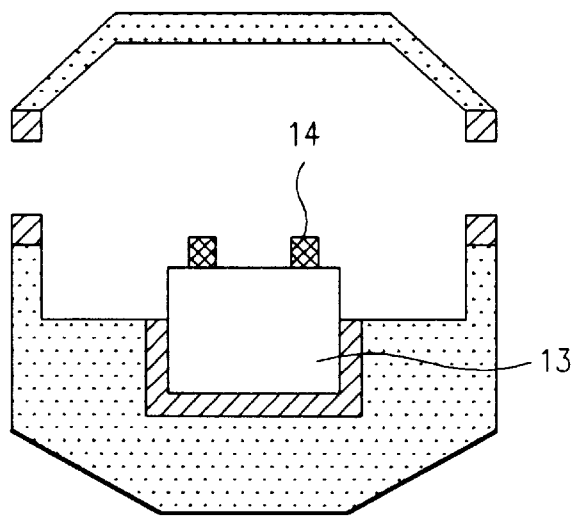

Thereafter, as shown in FIG. 2B, a semiconductor chip 13 having a bonding pad 14 thereon is mounted in the recess of the backer 10. The recess of the backer 10 serves to fix the semiconductor chip 13.

Next, as shown in FIG. 2C, a conductive epoxy 16 is formed on an edge portion of the lead 15, which is then contacted with a respective bonding pad 14 of the semiconductor chip 13.

As shown in FIG. 2D, the cap 11 and the backer 10 are adhered to each other in an $N_2$ ambient atmosphere at a temperature of 200° C.–250° C. by a pressure of 1–2 kg/cm$^3$. At this time, the backer 10 and the cap 11, both of whose edges are coated with the binder 12, adhere to each other the lead 15 when the binder 12 is melted. In addition, the conductive epoxy 16 formed on the edge of the lead 15 melts so as to adhere to the bonding pad 14 at a temperature of about 200° C. Bonding strength between the conductive epoxy 16 and the bonding pad 14 is strengthened because the edge of the lead 15 has good tension. That is to say, when the bonding pad 14 adheres to the lead 15, the bonding strength therebetween is 10 times greater than using a general wire is bonded. It is due to mechanical power caused by tension and bonding ability caused by the conductive epoxy.

Finally, as shown in FIG. 2E, the lead frame 15 is trimmed and formed in a predetermined shape, thereby completing the fabrication of a semiconductor package according to the present invention.

The method for manufacturing a semicondutor package has the following advantages. First, a bonding strength generated when the bonding pad adheres to the lead is 10 times as greater for a general wire, thereby obtaining a semiconductor package with a good reliability. Further, since a wire-bonding process is not needed, micro cracks in a semiconductor chip can be prevented, thereby improving production yield and thus enhancing productivity. Furthermore, since a die-bonding process, a wire-bonding process, and a molding process are all performed in one process step, processing time and production cost is reduced, thereby producing a semiconductor package with economical efficiency. That is to say, an manufacturing equipment according to the present invention can act simultaneously as a die bonder, a wire bonder, and molding machine It will be apparent to those skilled in the art that various modification and variations can be made in the method for manufacturing a semiconductor package of the present invention without departing from the spirit or scope of the inventions. Thus, it is intended that the present invention cover the modifications and variations of this invention provided they come within the scope of the appended claims and their equivalents.

What is claimed is:

1. A method for packaging a semiconductor chip, comprising the steps of:

disposing a semiconductor chip in a backer, the semiconductor chip having a bonding pad formed thereon;

connecting a lead of a lead frame to the bonding pad;

disposing a cap on the backer with the lead therebetween so as to cover the semiconductor chip; and simultaneously, bonding the cap and backer, bonding the semiconductor chip and the backer, and bonding the lead and the bonding pad.

2. The method according to claim 1, wherein said disposing step comprises disposing the semiconductor chip in the backer using a binder, and said step of bonding the cap and backer comprises attaching the cap to the backer using the same binder used in said disposing step, wherein said steps of bonding the cap and the backer and bonding the semiconductor chip and the backer comprise curing the binder so as to bond the cap and backer and bond the semiconductor chip and the backer.

3. The method according to claim 1, wherein said steps of, simultaneously, bonding the cap and backer, bonding the semiconductor chip and the backer, and bonding the lead and the bonding pad are performed at a temperature between 200° C. and 250° C. in an $N_2$ ambient atmosphere at a pressure of 1 to 2 kg/cm$^2$.

4. The method according to claim 1, wherein said connecting step comprises connecting the lead to the bonding pad with a conductive epoxy material.

5. The method according to claim 4, wherein said bonding step comprises curing the conductive epoxy material.

* * * * *